(12) United States Patent
McCall et al.

(10) Patent No.: US 6,515,610 B1
(45) Date of Patent: Feb. 4, 2003

(54) ANALOG-TO-DIGITAL CONVERSION FOR MULTIPLE VOLTAGE SIGNALS IN AN INTEGRATED CIRCUIT

(75) Inventors: Kevin Jon McCall, Lafayette, CO (US); Baker Perkins Lee Scott, III, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/988,903

(22) Filed: Nov. 19, 2001

(51) Int. Cl.[7] ................................................. H03M 1/12
(52) U.S. Cl. ....................................... 341/155; 341/141
(58) Field of Search ................................. 341/155, 141, 341/153, 154; 327/407

(56) References Cited

U.S. PATENT DOCUMENTS

| | | | |
|---|---|---|---|
| 4,594,577 A | * | 6/1986 | Mao ............................ 340/347 |
| 5,113,304 A | | 5/1992 | Ozaki et al. |
| 5,172,291 A | | 12/1992 | Bakely et al. |
| 5,367,302 A | | 11/1994 | Kalthoff et al. |
| 5,565,869 A | | 10/1996 | Brodie et al. |
| 5,627,805 A | | 5/1997 | Findelstein et al. |
| 5,696,559 A | | 12/1997 | Kim |
| 6,028,827 A | | 2/2000 | Alon et al. |
| 6,115,675 A | | 9/2000 | Benco et al. |
| 6,172,636 B1 | * | 1/2001 | Murden et al. ............. 341/155 |

* cited by examiner

*Primary Examiner*—Peguy JeanPierre
*Assistant Examiner*—Joseph Lauture

(57) ABSTRACT

An analog-to-digital conversion circuit converts parallel analog voltage signals into corresponding parallel analog current signals. The analog-to-digital conversion circuit multiplexes the parallel analog current signals into a time-interleaved analog current signal. The analog-to-digital conversion circuit converts the time-interleaved analog current signal into a corresponding time-interleaved analog voltage signal and provides gain for the time-interleaved analog voltage signal. The analog-to-digital conversion circuit converts the time-interleaved analog voltage signal into a corresponding digital signal having time-interleaved digital values corresponding to the parallel analog voltage signals.

20 Claims, 4 Drawing Sheets

ANALOG-TO-DIGITAL CONVERSION FOR MULTIPLE VOLTAGE SIGNALS IN AN INTEGRATED CIRCUIT

BACKGROUND OF THE INVENTION

1. Field of the Invention

The invention is related to the field of analog-to-digital conversion, and in particular, to circuitry for multiplexing currents to provide analog-to-digital conversion for multiple parallel voltage signals.

2. Statement of the Problem

Analog-to-Digital (A-D) conversion is a well-known and essential element of electronic signal processing. A-D Converters (ADCs) have been developed to convert analog voltage signals into digital signals with digital values corresponding to the analog voltages. As integrated circuits have developed, the number of analog voltage signals that need A-D conversion has grown, so the number of ADCs in integrated circuits has grown as well. Unfortunately, the growth in ADCs runs counter to the critical need to reduce the area and power requirements in most integrated circuits. To reduce the area and power of integrated circuits, the number of ADCs in an integrated circuit had to be reduced.

High-speed ADCs were developed to solve this problem. In this solution, multiple analog voltage signals are multiplexed together to form a time-interleaved analog voltage signal. The high-speed ADC receives the time-interleaved analog voltage signal and produces a corresponding time-interleaved digital signal. The digital signal from the ADC is de-multiplexed to obtain digital values that correspond to the analog voltages. Thus, multiple analog voltage signals may share a single high-speed ADC, and the number is ADCs is reduced.

It is often necessary to apply gain to an analog voltage signal. The gain increases the strength of the analog voltage signal to improve subsequent signal processing. Often, gain is applied by converting the voltage signal into a corresponding current signal, and then, by converting the current signal back into a corresponding voltage signal that has greater signal strength then the original voltage signal.

There are two basic techniques to combine the above gain and high-speed ADC technologies. The gain may be applied individually to the analog voltage signals before they are multiplexed to form the time-interleaved voltage signal for the ADC. Alternatively, the analog voltage signals may be multiplexed to form the time-interleaved voltage signal, and then, the gain may be applied to the time-interleaved voltage signal. Unfortunately, these solutions can be slow, and they may require increased power and area that may not be cost-effective for the integrated circuit.

SUMMARY OF THE SOLUTION

The invention helps solve the above problems with an A-D conversion circuit that provides voltage gain and uses a high-speed ADC. Advantageously, the A-D conversion circuit multiplexes the currents that are used to provide the voltage gain. Multiplexing currents can be faster than multiplexing voltages. The A-D conversion circuit can also use less area and power than previous solutions.

Some examples of the invention include an analog-to-digital conversion circuit or its method of operation. The analog-to-digital conversion circuit comprises a voltage-to-current conversion circuit, current multiplexer, current-to-voltage conversion circuit, and an analog-to-digital converter. The voltage-to-current conversion circuit converts parallel analog voltage signals into corresponding parallel analog current signals. The current multiplexer multiplexes the parallel analog current signals into a time-interleaved analog current signal. The current-to-voltage conversion circuit converts the time-interleaved analog current signal into a corresponding time-interleaved analog voltage signal and provides gain for the time-interleaved analog voltage signal. The analog-to-digital converter converts the time-interleaved analog voltage signal into a corresponding digital signal having time-interleaved digital values corresponding to the parallel analog voltage signals.

DESCRIPTION OF THE DRAWINGS

The same reference number represents the same element on all drawings.

DETAILED DESCRIPTION OF THE INVENTION

FIGS. 1–4 and the following description depict specific examples of A-D circuits to teach those skilled in the art how to make and use the best mode of the invention. For the purpose of teaching inventive principles, some conventional aspects of the circuits have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
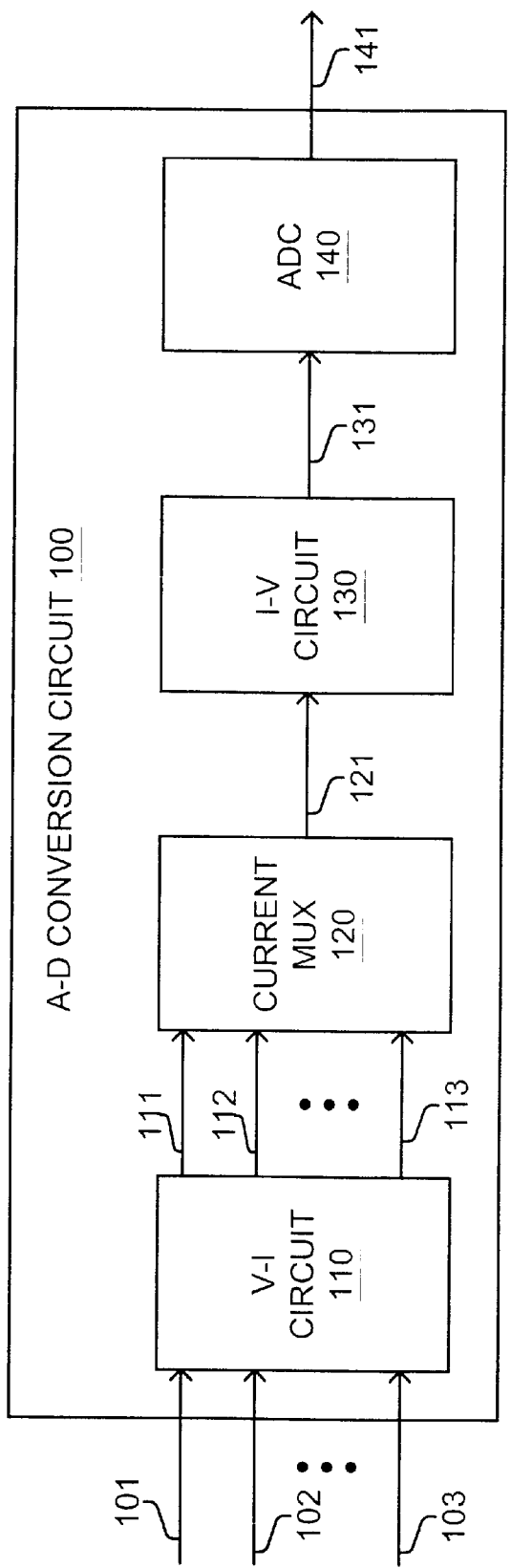
FIG. 1 illustrates an A-D conversion circuit in an example of the invention.

FIG. 1 illustrates A-D conversion circuit 100 in an example of the invention. A-D circuit 100 comprises Voltage-to-Current conversion (V-I) circuit 110, current multiplexer (mux) 120, Current-to-Voltage conversion (I-V) circuit 130, and ADC 140. In many cases, A-D conversion circuit 100 is included in a single integrated circuit, and there could be multiple such A-D conversion circuits within the same integrated circuit.

V-I circuit 110 receives parallel analog voltage signals 101–103. As indicated on FIG. 1, there could be multiple parallel signals, and the number shown is restricted for clarity. V-I circuit 110 converts parallel analog voltage signals 101–103 into corresponding parallel analog current signals 111–113. V-I circuit 110 transfers parallel analog current signals 111–113 to current mux 120. Current mux 120 multiplexes parallel analog current signals 111–113 into single time-interleaved analog current signal 121. Current mux 120 transfers time-interleaved analog current signal 121 to I-V circuit 130.

I-V circuit 130 converts time-interleaved analog current signal 121 into corresponding time-interleaved analog voltage signal 131. In the typical case, I-V circuit 130 provides gain for time-interleaved analog voltage signal 131 to assist in subsequent A-D conversion. I-V circuit 130 transfers time-interleaved analog voltage signal 131 to ADC 140. ADC 140 converts time-interleaved analog voltage signal 131 into a corresponding digital signal 141. Digital signal 141 has time-interleaved digital values proportional to the voltage levels in original parallel analog voltage signals 101–103.

In the context of the invention, the term "corresponding" means that voltage levels, current levels, and digital values are proportional in corresponding signals. For example: the voltage level in a voltage signal is proportional to the current level in a corresponding current signal; the current level in a current signal is proportional to the voltage level in a corresponding voltage signal; and the voltage level in a voltage signal is proportional to the digital value of a corresponding digital signal.

Parallel analog voltage signals 101–103 could comprise various types of signals. Parallel analog voltage signals 101–103 could comprise parallel data signals from a data storage system. For example, parallel analog voltage signals 101–103 could comprise parallel read signals from a tape drive, an optical disk drive, or a magnetic disk drive. Parallel analog voltage signals 101–103 could also comprise parallel audio signals or parallel telecommunication signals.

Figure 2:
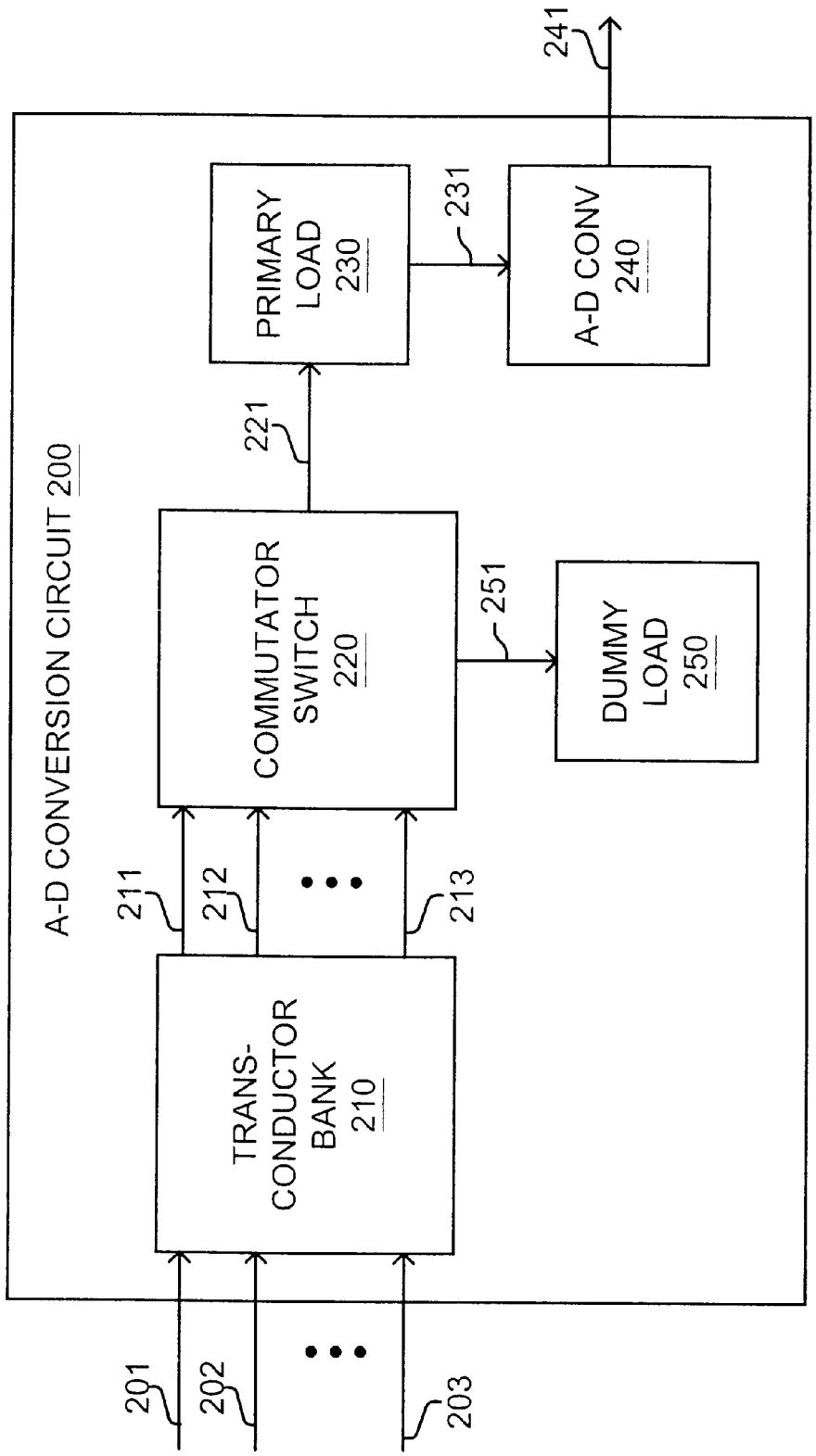
FIG. 2 illustrates an A-D conversion circuit in an example of the invention.

FIG. 2 illustrates A-D conversion circuit 200 in an example of the invention. A-D circuit 200 comprises transconductance bank 210, commutator switch 220, primary load 230, ADC 240, and dummy load 250. With respect to FIG. 1, transconductance bank 210 corresponds to V-I circuit 100, commutator switch 220 corresponds to current mux 120, and primary load 230 corresponds to I-V circuit 130.

Transconductance bank 210 receives parallel analog voltage signals 201–203. Transconductance bank 210 converts parallel analog voltage signals 201–203 into corresponding parallel analog current signals 211–213. Transconductance bank 210 transfers parallel analog current signals 211–213 to commutator switch 220.

Commutator switch 220 switches among parallel analog current signals 111–113 to form time-interleaved analog current signal 221. Commutator switch 220 couples individual parallel analog current signals 111–113 to primary load 230 on a rotation basis. Commutator switch 220 couples all other parallel analog current signals 111–113 to dummy load 250 when they are not coupled to the primary load 230. The following table illustrates this switch action for one rotation.

| COMMUTATOR SWITCH 220 | | | |
|---|---|---|---|
| TIME PERIOD | SIGNAL 211 | SIGNAL 212 | SIGNAL 213 |
| 1 | SWITCH TO PRIMARY LOAD 230 | SWITCH TO DUMMY LOAD 250 | SWITCH TO DUMMY LOAD 250 |
| 2 | SWITCH TO DUMMY LOAD 250 | SWITCH TO PRIMARY LOAD 230 | SWITCH TO DUMMY LOAD 250 |
| 3 | SWITCH TO DUMMY LOAD 250 | SWITCH TO DUMMY LOAD 250 | SWITCH TO PRIMARY LOAD 230 |
| 4 | SWITCH TO PRIMARY LOAD 230 | SWITCH TO DUMMY LOAD 250 | SWITCH TO DUMMY LOAD 250 |

From the above table, it should be appreciated that commutator switch 220 forms time-interleaved signal 221 by rotating the connection to primary load 230 among individual signals 211–213. When signals 211–213 are not coupled to primary load 220, commutator switch 220 couples the signals to dummy load 250. Commutator switch 220 may be comprised of separate but coordinated commutator switches or switch stages.

Dummy load 250 prevents a collapse of current on signals 211–213 when they are not coupled to primary load 230. It may be desirable to share dummy load 250 among all signals 211–213 to minimize the components required for dummy load 250. Alternatively, it may be desirable to isolate signals 211–213 from one another by coupling each signal to its own dummy load. Thus, dummy load 250 represents a shared dummy load or a group of individual dummy loads.

Commutator switch 220 transfers time-interleaved analog current signal 221 to primary load 230. Primary load 230 converts time-interleaved analog current signal 121 into corresponding time-interleaved analog voltage signal 231. Primary load 230 provides gain for time-interleaved analog voltage signal 231 to assist in A-D conversion or other signal processing. Primary load 230 transfers time-interleaved analog voltage signal 231 to ADC 240. ADC 140 converts time-interleaved analog voltage signal 231 into corresponding digital signal 241. Digital signal 241 has time-interleaved digital values proportional to the voltage levels in original parallel analog voltage signals 201–203.

Figure 3:
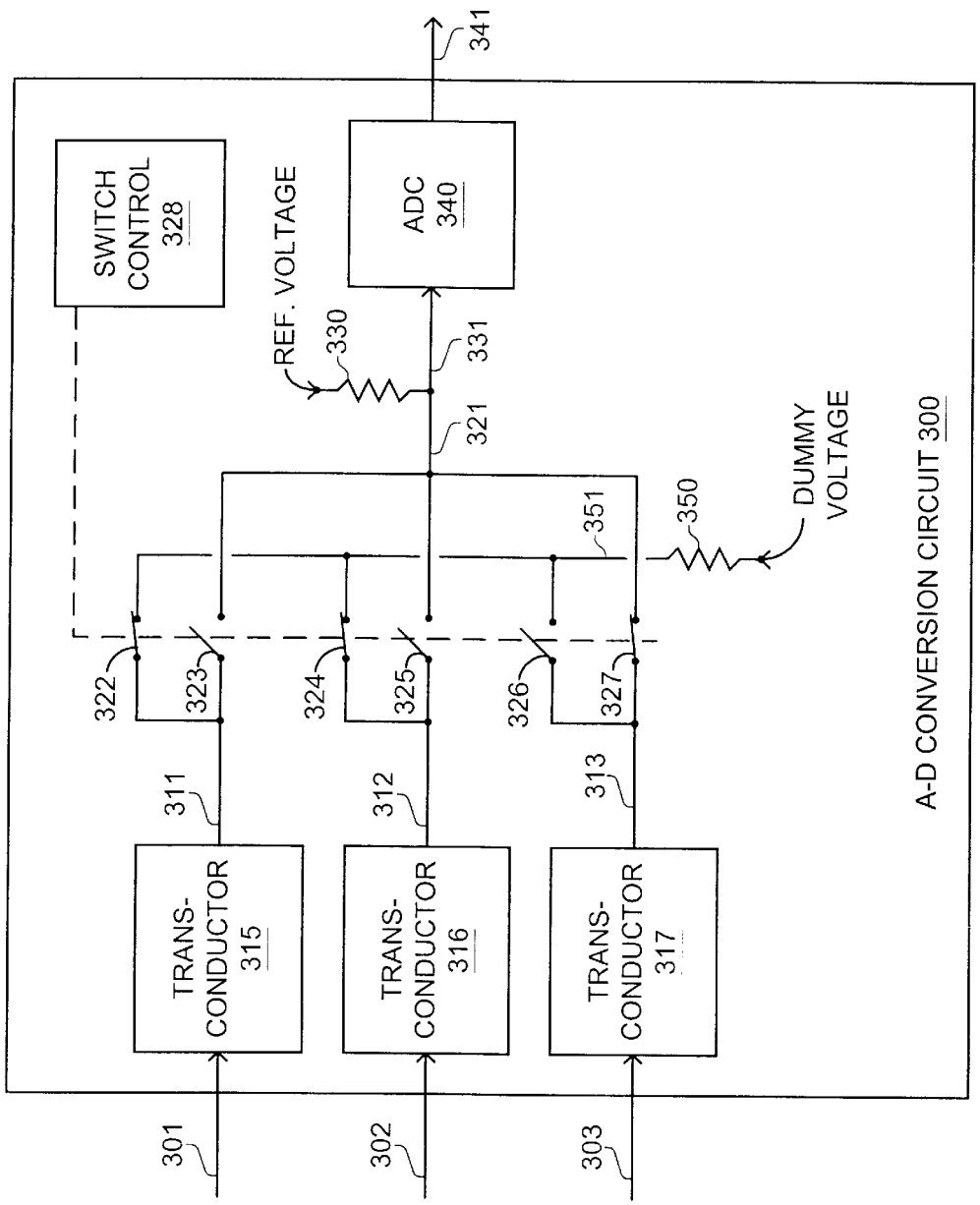
FIG. 3 illustrates an A-D conversion circuit in an example of the invention.

FIG. 3 illustrates A-D conversion circuit 300 in an example of the invention. A-D conversion circuit 300 comprises transconductors 315–317, switches 322–327, switch control 328, primary load 330, ADC 340, and dummy load 350. As would be appreciated by those skilled in the art, primary load 350 could be a resistive load, and dummy load 350 could be a pair MOSFET transistors biased with the dummy voltage.

Transconductance 315 receives and converts voltage signal 301 into corresponding current signal 311. Transconductance 316 receives and converts voltage signal 302 into corresponding current signal 312. Transconductance 317 receives and converts voltage signal 303 into corresponding current signal 313.

Switches 322 and 323 receive current signal 311. Switches 324 and 325 receive current signal 312. Switches 326 and 327 receive current signal 313. Switch control 328 operates switches 322–327 as follows. Switches 323, 325, and 327 are closed one at a time on a rotating basis to form time-interleaved analog current signal 321. When switch 323 is closed, switch 322 is open, and when switch 323 is open, switch 322 is closed. When switch 325 is closed, switch 324 is open, and when switch 325 is open, switch 324 is closed. When switch 327 is closed, switch 326 is open, and when switch 327 is open, switch 326 is closed.

At a given moment in time, signal 321 includes one of signals 311–312, and signal 351 includes the remaining two signals. A dummy voltage is applied to dummy load 350 to prevent a collapse of current in signal 351 and its two component signals. A reference voltage is applied to primary load 330 to convert time-interleaved analog current signal 321 into time-interleaved analog voltage signal 331. ADC 340 converts time-interleaved analog voltage signal 331 into digital signal 341. Digital signal 341 has time-interleaved digital values proportional to the voltage levels in original parallel analog voltage signals 301–303.

Figure 4:
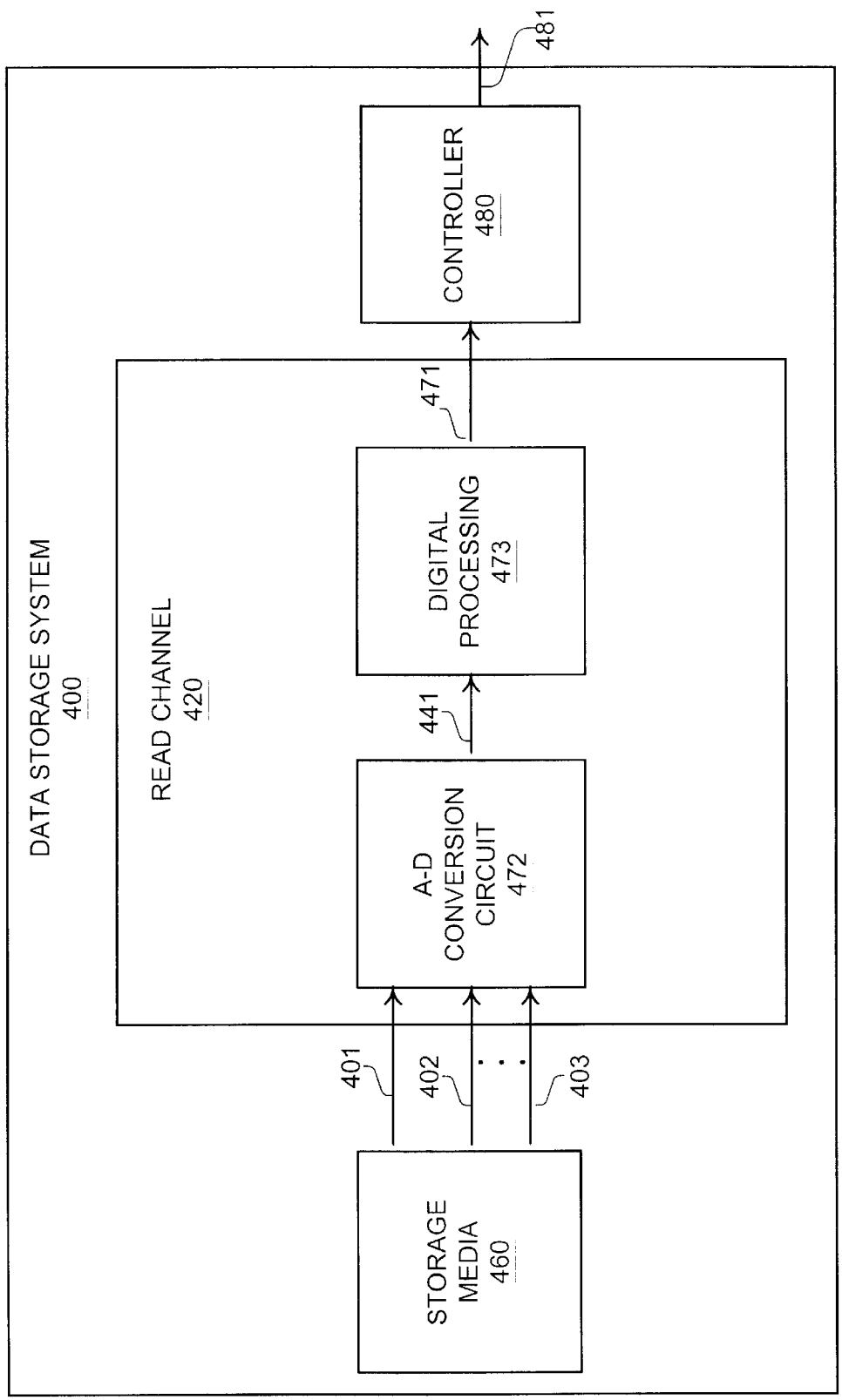
FIG. 4 illustrates a data storage system in an example of the invention.

FIG. 4 illustrates data storage system 400 in an example of the invention. Data storage system 400 comprises storage media 460, read channel 470, and controller 480. Read channel 470 comprises A-D conversion circuit 472 and digital processing 473. A-D conversion circuit 472 is configured and operates as described above for circuits 100, 200, and 300. Aside from A-D conversion circuit 472, the components of data storage system 400 could be conventional. Storage media 460 could use tapes, optical disks, magnetic disks, or some other type of storage device.

Storage media 460 stores user data. Storage media transfers parallel channels 401–403 to A-D conversion circuit 472 in read channel 470. Each parallel channel 401–403 comprises an analog voltage signal that represents a portion of the user data. A-D conversion circuit 472 operates as described above to convert parallel channels 401–403 into digital signal 441. Digital signal 441 has time-interleaved digital values that are proportional to the voltage levels of original parallel channels 401–403.

Digital processing 473 processes digital signal 441 to generate digital signal 471. This processing typically involves filtering, timing adjustment, bit detection, and decoding. Digital signal 471 represents the decoded user data. Controller 480 receives and buffers digital signal 471 before transferring digital signal 481 from the buffer. Digital signal 481 also represents the user data. Controller 480 also provides a user command interface and overall system control.

What is claimed is:

1. An analog-to-digital conversion circuit comprising:
   a voltage-to-current conversion circuit configured to convert parallel analog voltage signals into corresponding parallel analog current signals;
   a current multiplexer configured to multiplex the parallel analog current signals into a time-interleaved analog current signal;
   a current-to-voltage conversion circuit configured to convert the time-interleaved analog current signal into a corresponding time-interleaved analog voltage signal and to provide gain for the time-interleaved analog voltage signal; and
   an analog-to-digital converter configured to convert the time-interleaved analog voltage signal into a corresponding digital signal having time-interleaved digital values corresponding to the parallel analog voltage signals.

2. The analog-to-digital conversion circuit of claim 1 wherein the current multiplexer comprises a commutator switch configured to couple individual ones of the parallel analog current signals to the current-to-voltage conversion circuit on a rotation basis and to couple all other ones of the parallel analog current signals to a dummy load when not coupled to the current-to-voltage conversion circuit.

3. The analog-to-digital conversion circuit of claim 1 wherein the current multiplexer is configured to couple ones of the parallel analog current signals to dummy loads when the ones of the parallel analog current signals are not used to generate the time-interleaved analog current signal.

4. The analog-to-digital conversion circuit of claim 1 wherein the voltage-to-current conversion circuit comprises a plurality of transconductors.

5. The analog-to-digital conversion circuit of claim 1 wherein the parallel analog voltage signals comprise parallel data signals from a data storage system.

6. The analog-to-digital conversion circuit of claim 1 wherein the parallel analog voltage signals comprise parallel read signals from one of a tape drive and a disk drive.

7. The analog-to-digital conversion circuit of claim 1 wherein the voltage-to-current conversion circuit, the current multiplexer, the current-to-voltage conversion circuit, and the analog-to-digital converter are included in a data storage system read channel.

8. The analog-to-digital conversion circuit of claim 1 wherein the parallel analog voltage signals comprise parallel audio signals.

9. The analog-to-digital conversion circuit of claim 1 wherein the parallel analog voltage signals comprise parallel telecommunication signals.

10. The analog-to-digital conversion circuit of claim 1 wherein the voltage-to-current conversion circuit, the current multiplexer, the current-to-voltage conversion circuit, and the analog-to-digital converter are included in a single integrated circuit.

11. A method of operating an analog-to-digital conversion circuit, the method comprising:
    converting parallel analog voltage signals into corresponding parallel analog current signals;
    multiplexing the parallel analog current signals into a time-interleaved analog current signal;
    converting the time-interleaved analog current signal into a corresponding time-interleaved analog voltage signal and providing gain for the time-interleaved analog voltage signal; and
    converting the time-interleaved analog voltage signal into a corresponding digital signal having time-interleaved digital values corresponding to the parallel analog voltage signals.

12. The method of claim 11 wherein multiplexing the parallel analog current signals into the time-interleaved analog current signal comprises coupling individual ones of the parallel analog current signals to a primary load on a rotation basis and coupling all other ones of the parallel analog current signals to a dummy load when not coupled to the primary load.

13. The method of claim 11 wherein multiplexing the parallel analog current signals into the time-interleaved analog current signal comprises coupling ones of the parallel analog current signals to dummy loads when the ones of the parallel analog current signals are not used to generate the time-interleaved analog current signal.

14. The method of claim 11 wherein converting the parallel analog voltage signals into corresponding parallel analog current signals comprises using a plurality of transconductors.

15. The method of claim 11 wherein the parallel analog voltage signals comprise parallel data signals from a data storage system.

16. The method of claim 11 wherein the parallel analog voltage signals comprise parallel read signals from one of a tape drive and a disk drive.

17. The method of claim 11 wherein the method is performed in a data storage system read channel.

18. The method of claim 11 wherein the parallel analog voltage signals comprise parallel audio signals.

19. The method of claim 11 wherein the parallel analog voltage signals comprise parallel telecommunication signals.

20. The analog-to-digital conversion circuit of claim 1 wherein the method is performed in a single integrated circuit.

* * * * *